United States Patent
Huang et al.

(10) Patent No.: US 9,679,926 B2
(45) Date of Patent: Jun. 13, 2017

(54) METHOD OF MANUFACTURING PIXEL STRUCTURE AND PIXEL STRUCTURE

(71) Applicant: E Ink Holdings Inc., Hsinchu (TW)

(72) Inventors: Kun-Lung Huang, Hsinchu (TW); Wu-Liu Tsai, Hsinchu (TW); Pei-Lin Huang, Hsinchu (TW)

(73) Assignee: E Ink Holdings Inc., Hsinchu (TW)

(*) Notice: Subject to any disclaimer, the term of this patent is extended or adjusted under 35 U.S.C. 154(b) by 0 days.

(21) Appl. No.: 15/133,218

(22) Filed: Apr. 19, 2016

(65) Prior Publication Data

US 2017/0033132 A1  Feb. 2, 2017

(30) Foreign Application Priority Data

Jul. 28, 2015 (TW) ............... 104124403 A

(51) Int. Cl.
*H01L 29/786* (2006.01)
*H01L 27/12* (2006.01)

(52) U.S. Cl.
CPC ...... *H01L 27/1255* (2013.01); *H01L 27/1259* (2013.01)

(58) Field of Classification Search
CPC ............. H01L 27/1255; H01L 27/3262; H01L 27/2365; H01L 29/7869; H01L 27/3248; H01L 29/4908; H01L 21/31144; H01L 29/78675; H01L 21/28008; H01L 21/283; H01L 21/467; H01L 29/786; H01L 29/78618

See application file for complete search history.

(56) References Cited

U.S. PATENT DOCUMENTS

| | | |
|---|---|---|
| 9,040,987 B2 | 5/2015 | Lan et al. |
| 2009/0289259 A1 | 11/2009 | Huang et al. |
| 2010/0099204 A1 | 4/2010 | Lai |
| 2011/0147757 A1 | 6/2011 | Kim et al. |
| 2012/0028392 A1 | 2/2012 | Park |

(Continued)

FOREIGN PATENT DOCUMENTS

| | | |
|---|---|---|
| TW | 200720737 A | 6/2007 |
| TW | 200912431 A | 3/2009 |

OTHER PUBLICATIONS

Corresponding Taiwanese Office Action that these art references were cited on Jul. 6, 2016.

*Primary Examiner* — Allen Parker
*Assistant Examiner* — Frederick B Hargrove
(74) *Attorney, Agent, or Firm* — CKC & Partners Co., Ltd.

(57) ABSTRACT

A method of manufacturing a pixel structure includes: forming a source, a drain and a first capacitor electrode; forming a semiconductor layer in contact with a portion of the source and a portion of the drain; forming a gate and a second capacitor electrode, and the second capacitor electrode substantially aligned with the first capacitor electrode; forming a gate insulating layer between the semiconductor layer, the source, the drain and the first capacitor electrode, and the gate and the second capacitor electrode; forming a passivation layer over the source, the drain, the first capacitor electrode, the semiconductor layer, the gate and the second capacitor electrode; and forming a pixel electrode over the passivation layer, and the pixel electrode substantially aligned with the first capacitor electrode.

6 Claims, 6 Drawing Sheets

(56) References Cited

U.S. PATENT DOCUMENTS

| | | | |
|---|---|---|---|
| 2013/0075766 A1* | 3/2013 | Chang | H01L 27/1255 257/88 |
| 2014/0117362 A1 | 5/2014 | Xi | |
| 2014/0299843 A1 | 10/2014 | Kim | |
| 2014/0326963 A1 | 11/2014 | Yang et al. | |
| 2015/0214248 A1* | 7/2015 | Chou | H01L 27/1225 257/40 |
| 2016/0020333 A1* | 1/2016 | Gao | H01L 27/1288 257/71 |

\* cited by examiner

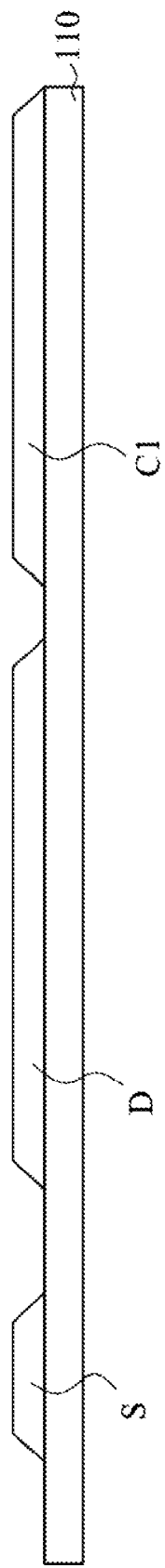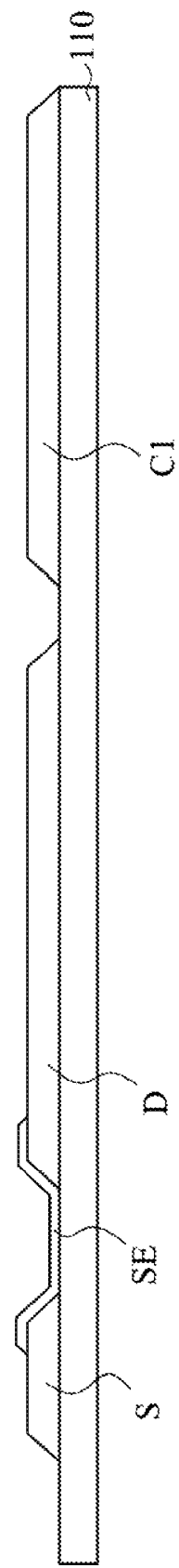

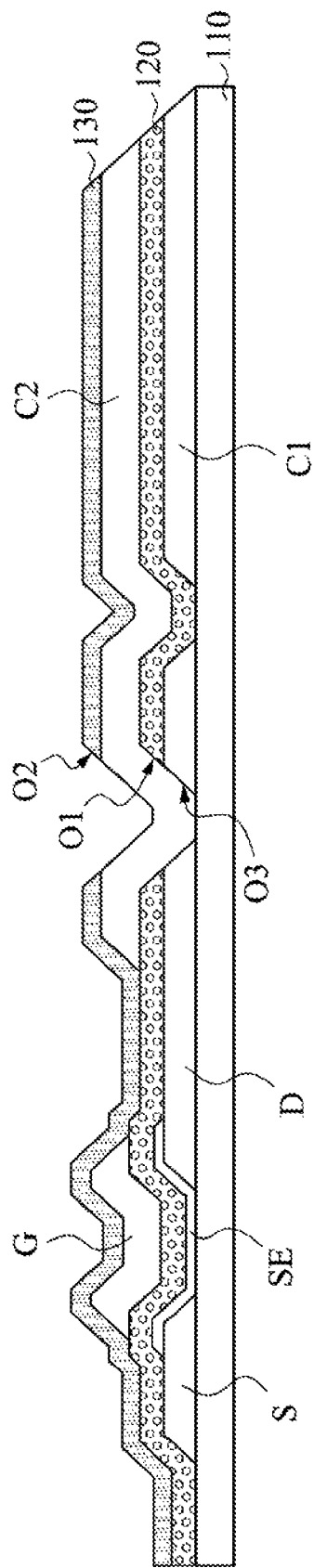
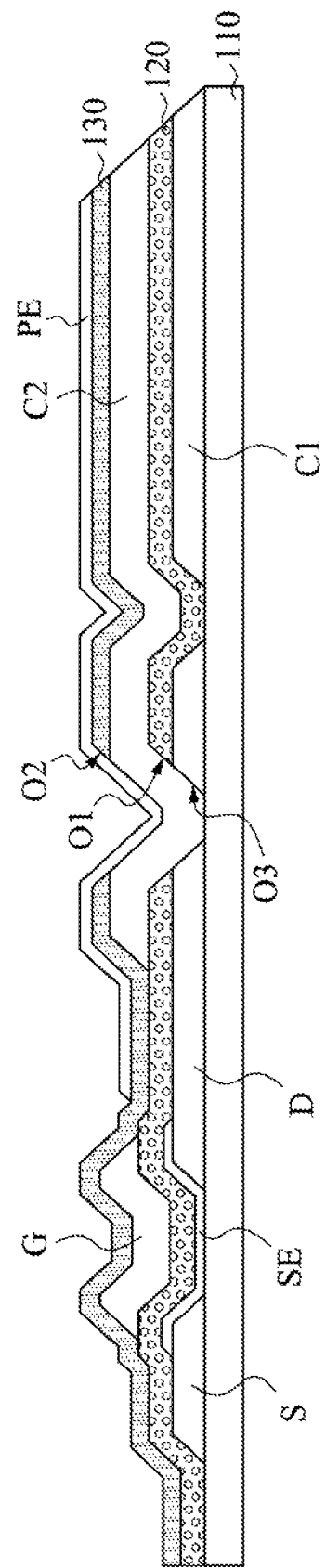

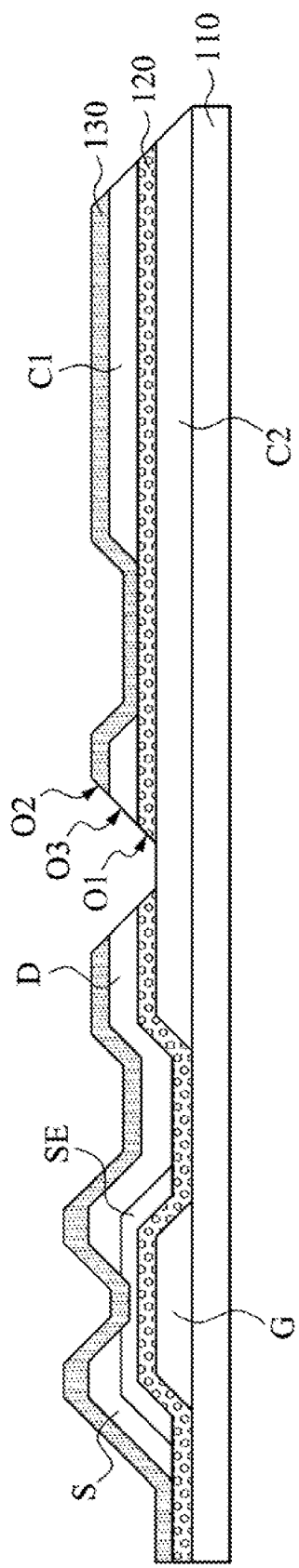
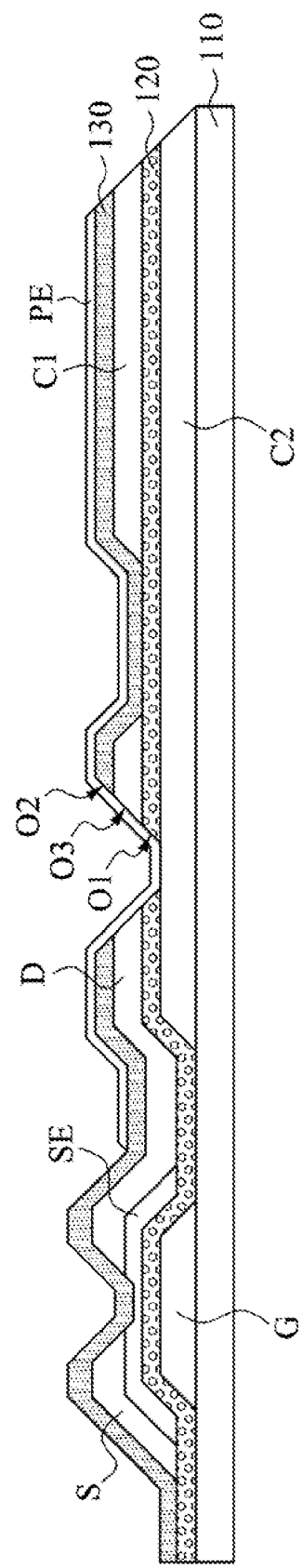
Fig. 2E
Fig. 2F

METHOD OF MANUFACTURING PIXEL STRUCTURE AND PIXEL STRUCTURE

RELATED APPLICATIONS

This application claims priority to Taiwan Application Serial Number 104124403, filed Jul. 28, 2015, which is herein incorporated by reference.

BACKGROUND

Field of Invention

The present disclosure relates to a method of manufacturing a pixel structure and a pixel structure.

Description of Related Art

E-paper is a display technology having advantages of paper-like, ultra-thin, lightweight, bendable, and low power consumption.

An E-paper display (or called as electronic ink display) usually includes a first transparent substrate, a common electrode layer, an electronic ink layer, a pixel array and a second transparent substrate. The pixel array includes a plurality of pixel structures. Each of the pixel structures includes at least one thin film transistor. The thin film transistor includes a gate, a gate dielectric layer, a semiconductor layer, a source and a drain.

According to a position of the gate of the thin film transistor, it can be classified into a bottom gate type thin film transistor and a top gate type thin film transistor. Generally, layout of a pixel structure including one type (e.g., bottom gate type) thin film transistor and peripheral circuits thereof exhibiting good device performance, such as has enough capacitance, fails to directly apply on layout of a pixel structure including the other type thin film transistor and peripheral circuits thereof. As such, after development of a pixel structure including one type thin film transistor and peripheral circuits thereof, there is a need to spend time for developing a pixel structure including the other type thin film transistor and peripheral circuits thereof.

SUMMARY

A purpose of the present disclosure is to provide a method of manufacturing a pixel structure including a bottom gate type thin film transistor with enough capacitance or a pixel structure including a top gate type thin film transistor with enough capacitance without changing peripheral circuits. As such, after development of a pixel structure including one type thin film transistor and peripheral circuits thereof, there is no need to spend time for developing a pixel structure including the other type thin film transistor and peripheral circuits thereof.

The present disclosure provides a method of manufacturing a pixel structure, including: forming a source, a drain and a first capacitor electrode; forming a semiconductor layer in contact with a portion of the source and a portion of the drain; forming a gate and a second capacitor electrode, and the second capacitor electrode substantially aligned with the first capacitor electrode; forming a gate dielectric layer between the semiconductor layer, the source, the drain and the first capacitor electrode, and the gate and the second capacitor electrode; forming a passivation layer over the source, the drain, the first capacitor electrode, the semiconductor layer, the gate and the second capacitor electrode; and forming a pixel electrode over the passivation layer, and the pixel electrode substantially aligned with the first capacitor electrode.

According to one embodiment of the present disclosure, the second capacitor electrode has a potential equal to a potential of the pixel electrode.

According to one embodiment of the present disclosure, forming the gate dielectric layer between the semiconductor layer, the source, the drain and the first capacitor electrode, and the gate and the second capacitor electrode is performed after forming the source, the drain and the first capacitor electrode, and the method further includes forming a first opening through the gate dielectric layer, and forming the gate and the second capacitor electrode includes forming the second capacitor electrode in the first opening.

According to one embodiment of the present disclosure, the method further includes forming a second opening through the passivation layer, and the second opening is substantially aligned with the first opening, and forming the pixel electrode includes forming the pixel electrode in the second opening and in contact with the second capacitor electrode.

According to one embodiment of the present disclosure, the method further includes forming a third opening through the drain and substantially aligned with the first opening, and forming the gate and the second capacitor electrode includes forming the second capacitor electrode in the third opening.

The present disclosure further provides a pixel electrode includes: a source, a drain and a first capacitor electrode, in which the first capacitor electrode has a common voltage potential; a semiconductor layer in contact with a portion of the source and a portion of the drain; a gate and a second capacitor electrode, and the gate over the semiconductor layer, the source and the drain, and the second capacitor electrode over the first capacitor electrode, and the second capacitor electrode substantially aligned with the first capacitor electrode; a gate dielectric layer between the semiconductor layer, the source, the drain and the first capacitor electrode, and the gate and the second capacitor electrode; a passivation layer over the source, the drain, the first capacitor electrode, the semiconductor layer, the gate and the second capacitor electrode; and a pixel electrode over the passivation layer.

According to one embodiment of the present disclosure, the second capacitor electrode has a potential equal to a potential of the pixel electrode.

According to one embodiment of the present disclosure, the gate dielectric layer has a first opening, and the second capacitor electrode is in the first opening.

According to one embodiment of the present disclosure, the passivation layer has a second opening over the first opening and substantially aligned with the first opening, and the pixel electrode is in the second opening and in contact with the second capacitor electrode.

According to one embodiment of the present disclosure, the drain has a third opening beneath the first opening and substantially aligned with the first opening, and the second capacitor electrode is in the third opening.

BRIEF DESCRIPTION OF THE DRAWINGS

The invention can be more fully understood by reading the following detailed description of the embodiment, with reference made to the accompanying drawings as follows:

FIGS. 1A-1F are cross-sectional views at various stages of manufacturing a pixel structure according to one embodiment of the present disclosure; and FIGS. 2A-2F are cross-sectional views at various stages of manufacturing a pixel structure according to another embodiment of the present disclosure.

DETAILED DESCRIPTION

The present disclosure is described by the following specific embodiments. Those with ordinary skill in the arts can readily understand the other advantages and functions of the present invention after reading the disclosure of this specification. The present disclosure can also be implemented with different embodiments. Various details described in this specification can be modified based on different viewpoints and applications without departing from the scope of the present disclosure.

Figure 1C:
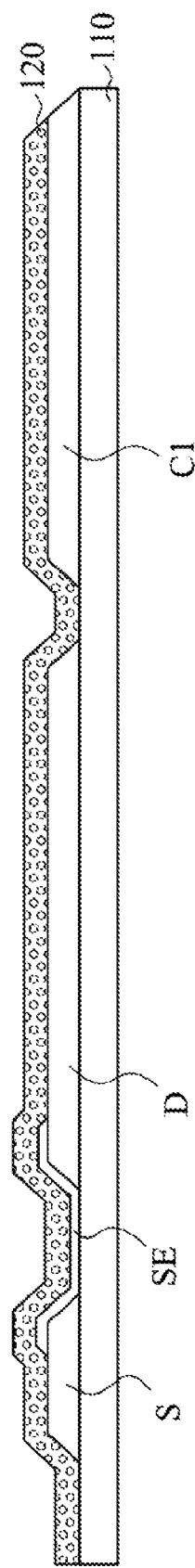

The present disclosure provides a method of manufacturing a pixel structure. FIGS. 1A-1F are cross-sectional views at various stages of manufacturing a pixel structure according to one embodiment of the present disclosure. As shown in FIG. 1A, a substrate 110 is provided. The substrate 110 may be a single-layered or multi-layered structure, which may be made of glass, quartz, transparent polymer material or other suitable materials.

Still referring to FIG. 1A, a source S, a drain D and a first capacitor electrode C1 are formed over the substrate 110 and separated from each other. In one embodiment, a conductive layer (not shown) is blanket formed over the substrate 110. For example, sputtering, evaporation or other suitable thin film deposition techniques may be utilized to form the conductive layer over the substrate 110. The conductive layer may be a single-layered or multi-layered structure, and may include metal or alloy, such as molybdenum, chromium, aluminum, neodymium, titanium, copper, silver, gold, zinc, indium, gallium, other suitable metals of a combination thereof. In one embodiment, a first photolithographic and etching process using a first photo mask is performed on the conductive layer to form the source S, the drain D and the first capacitor electrode C1. In one embodiment, when the source S, the drain D and the first capacitor electrode C1 are formed, a data line (not shown) and a common electrode line (not shown) are simultaneously formed over the substrate 110, and the source S, the drain D, the first capacitor electrode C1, the data line and the common electrode line are belong to a same patterned conductive layer. In one embodiment, the first capacitor electrode C1 is coupled or connected to the common electrode line, and thus may have a common voltage potential. Therefore, in this embodiment, the first capacitor electrode C1 may be called as a common capacitor electrode.

Next, as shown in FIG. 1B, a semiconductor layer SE is formed over the source S and the drain D to be in contact with a portion of the source S and a portion of the drain D. In one embodiment, a semiconductor material layer (not shown) is blanket formed over the source S, the drain D and the first capacitor electrode C1. For example, vacuum coating (e.g., physical vapor deposition or chemical vapor deposition) or liquid coating (e.g., spin coating or slit coating) can be utilized to form the semiconductor material layer. The semiconductor material layer may include amorphous silicon, polycrystalline silicon, microcrystalline silicon, monocrystalline silicon, organic semiconductor, oxide semiconductor or other suitable materials. In one embodiment, the semiconductor layer SE includes metal oxide or alloy oxide, such as indium oxide, indium gallium oxide, indium gallium oxide, indium zinc oxide, zinc oxide, zinc tin oxide, chromium tin oxide, gallium tin oxide, titanium tin oxide, copper aluminum oxide, strontium copper oxide, lanthanum copper oxysulfide, other suitable materials or a combination thereof. In one embodiment, a second photolithographic and etching process using a second photo mask is performed on the semiconductor material layer to form the semiconductor layer SE. In another embodiment, a semiconductor layer is formed, and a source, a drain and a first capacitor electrode are then formed.

As shown in FIG. 1C, a gate dielectric layer 120 is formed over the semiconductor layer SE, the source S, the drain D and the first capacitor electrode C1. In one embodiment, the gate dielectric layer 120 is blanket formed over the semiconductor layer SE, the source S, the drain D and the first capacitor electrode C1. For example, a chemical vapor deposition or other suitable thin film deposition techniques may be utilized to form the gate dielectric layer 120. The gate dielectric layer 120 may be a single-layered or multi-layered structure, which may include organic dielectric material, inorganic dielectric material or a combination thereof. The organic dielectric material may be polyimide (PI), other suitable materials or a combination thereof; the inorganic dielectric material may be silicon oxide, silicon nitride, silicon oxynitride, other suitable materials or a combination thereof.

Figure 1D:
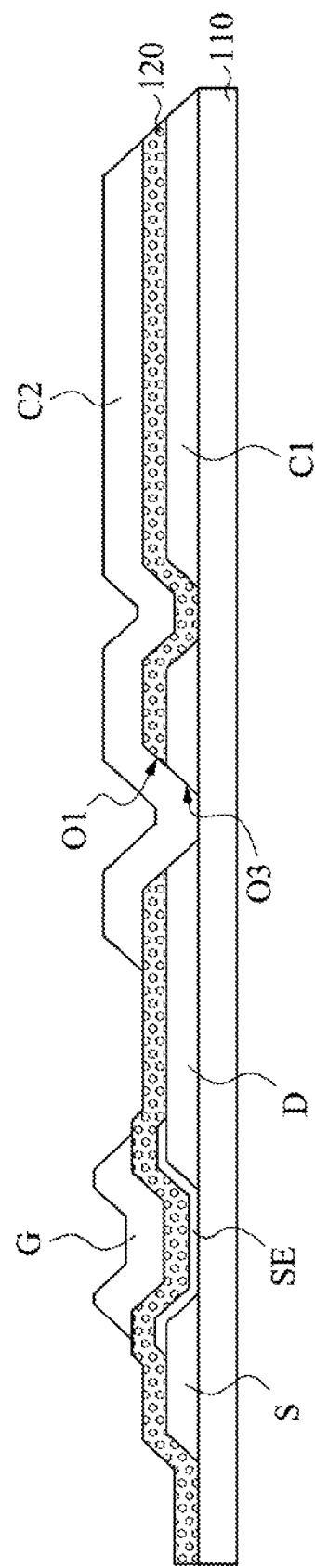

As shown in FIG. 1D, a third photolithographic and etching process using a third photo mask is performed on the gate dielectric layer 120 to form a first opening O1 through the gate dielectric layer 120 and a third opening O3 through the drain D. The third opening O3 is substantially aligned with the first opening O1. The term "substantially aligned with" refers to a vertical projection of a component to the substrate 110 is entirely or partially overlapped with a vertical projection of another component to the substrate 110. That is, a vertical projection of the third opening O3 to the substrate 110 is entirely or partially overlapped with a vertical projection of the first opening O1 to the substrate 110. As shown in FIG. 1D, the vertical projection of the third opening O3 to the substrate 110 is in the vertical projection of the first opening O1 to the substrate 110.

Still referring to FIG. 1D, after the first opening O1 and the third opening O3 are formed, a gate G and a second capacitor electrode C2 are formed over the gate dielectric layer 120, and the second capacitor electrode C2 is substantially aligned with the first capacitor electrode C1. The gate G and the second capacitor electrode C2 are separated from each other. The gate dielectric layer 120 is between the semiconductor layer SE, the source S, the drain D and the first capacitor electrode C1, and the gate G and the second capacitor electrode C2. In one embodiment, a conductive layer (not shown) is blanket formed over the gate dielectric layer 120. For example, sputtering, evaporation or other suitable thin film deposition techniques may be utilized to form the conductive layer over the gate dielectric layer 120. The conductive layer may be a single-layered or multi-layered structure, and may include metal or alloy, such as molybdenum, chromium, aluminum, neodymium, titanium, copper, silver, gold, zinc, indium, gallium, other suitable metals of a combination thereof. In one embodiment, a fourth photolithographic and etching process using a fourth photo mask is performed on the conductive layer to form the gate G and the second capacitor electrode C2. In one embodiment, when the gate G and the second capacitor electrode C2 are formed over the gate dielectric layer 120, a scan line (not shown) is simultaneously formed over the gate dielectric layer 120, and the gate G, the second capacitor electrode C2 and the scan line are belong to a same patterned conductive layer. In one embodiment, as shown in FIG. 1D, the gate G is formed over the semiconductor layer SE and substantially aligned with the semiconductor layer SE. The second capacitor electrode C2 is not only formed over the first capacitor electrode C1 but also formed in the first opening O1 and the third opening O3.

Subsequently, as shown in FIG. 1E, a passivation layer 130 is formed over the source S, the drain D, the first capacitor electrode C1, the semiconductor layer SE, the gate G and the second capacitor electrode C2. In one embodiment, the passivation layer 130 is blanket formed over the source S, the drain D, the first capacitor electrode C1, the semiconductor layer SE, the gate G and the second capacitor electrode C2. For example, a chemical vapor deposition or other thin film techniques may be utilized to form the passivation layer 130. The passivation layer 130 may be a single-layered or multi-layered structure, which may include organic dielectric material, inorganic dielectric material or a combination thereof. Next, in one embodiment, a fifth photolithographic and etching process using a third photo mask is performed on the passivation layer 130 to form a second opening O2 through the passivation layer 130 and exposing the second capacitor electrode C2. The second opening O2 is substantially aligned with the first opening O1.

As shown in FIG. 1F, a pixel electrode PE is formed over the passivation layer 130, and the pixel electrode PE is substantially aligned with the first capacitor electrode C1 and the second capacitor electrode C2. In one embodiment, a pixel electrode material layer (not shown) is blanket formed over the passivation layer 130. For example, sputtering or other thin film deposition technique may be utilized to form the pixel electrode material layer over the passivation layer 130. The pixel electrode material layer may be a single-layered or multi-layered structure, and may be made of a transparent conductive material, such as indium tin oxide, hafnium oxide, aluminum zinc oxide, aluminum tin oxide, gallium zinc oxide, indium titanium oxide, indium molybdenum oxide or other suitable transparent conductive materials. Next, in one embodiment, a sixth photolithographic and etching process using a fifth photo mask is performed on the pixel electrode material layer to form the pixel electrode PE. In one embodiment, as shown in FIG. 1F, the pixel electrode PE is not only formed over the first capacitor electrode C1 and the second capacitor electrode C2 but also formed in the second opening O2 and in contact with the second capacitor electrode C2. As such, the pixel electrode PE is coupled to the drain D through the second capacitor electrode C2, and a potential of the second capacitor electrode C2 is equal to that of the pixel electrode PE.

As shown in FIG. 1F, the formed pixel structure including the top gate type thin film transistor includes a capacitor, which is constituted by the first capacitor electrode C1 having the common voltage potential, the gate dielectric layer 120 and the second capacitor electrode C2 which has a potential equal to that of the pixel electrode PE. The pixel structure including the top gate type thin film transistor has enough capacitance.

Figure 2A:
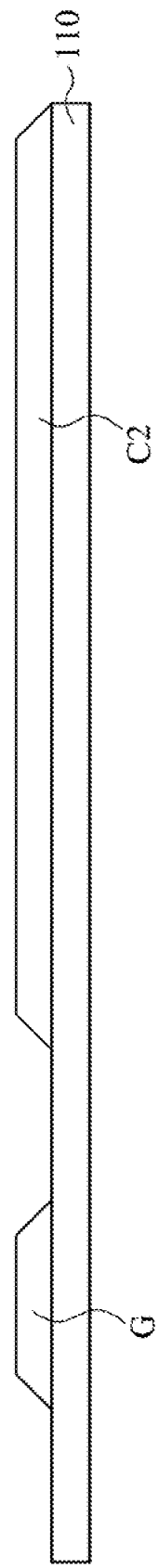

FIGS. 2A-2F are cross-sectional views at various stages of manufacturing a pixel structure according to another embodiment of the present disclosure. As shown in FIG. 2A, a substrate 110 is provided. Next, a gate G and a second capacitor electrode C2 are formed over the substrate 110. In one embodiment, a conductive layer is blanket formed over the substrate 110, and a first photolithographic and etching process using a first photo mask is then performed on the conductive layer to form the gate G and the second capacitor electrode C2.

Figure 2B:
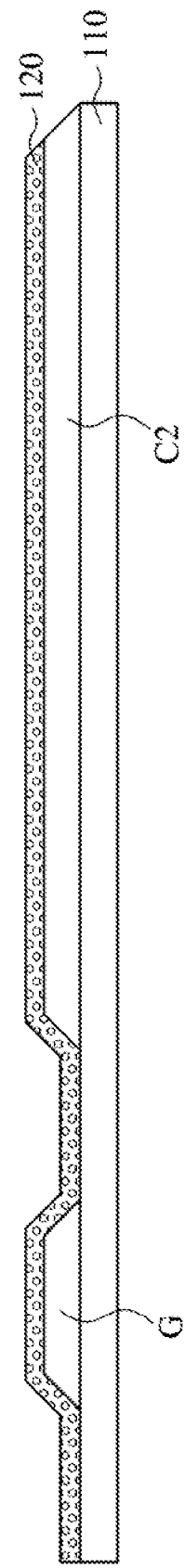

As shown in FIG. 2B, a gate dielectric layer 120 is formed over the gate G and the second capacitor electrode C2. In one embodiment, the gate dielectric layer 120 is blanket formed covering the gate G and the second capacitor electrode C2.

Figure 2C:
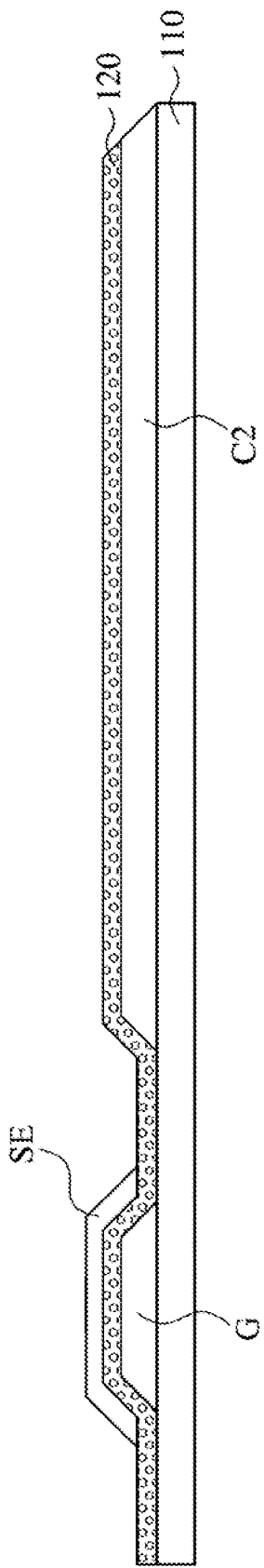

As shown in FIG. 2C, a semiconductor layer SE is formed over the gate G. In one embodiment, a semiconductor material layer (not shown) is blanket formed over the source S, the drain D and the first capacitor electrode C1, and a second photolithographic and etching process using a second photo mask is then performed on the semiconductor material layer to form the semiconductor layer SE.

Figure 2D:
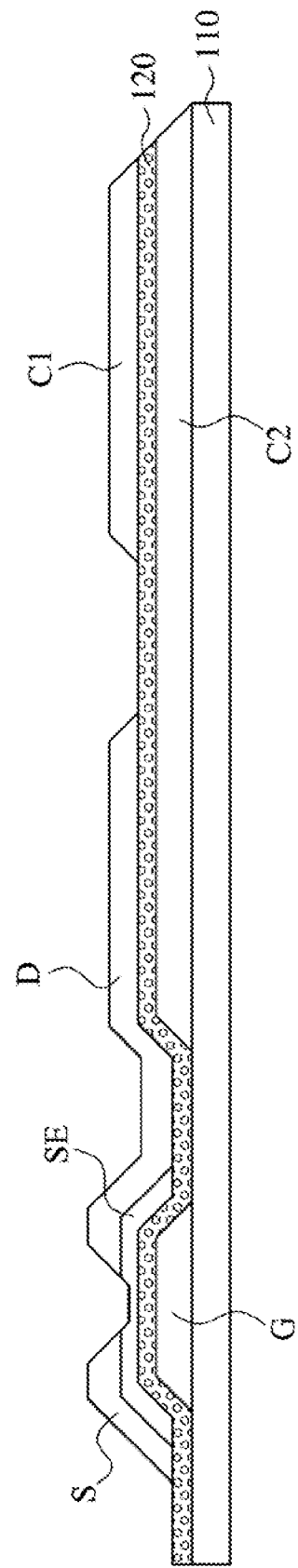

As shown in FIG. 2D, a source S and a drain D are formed over the semiconductor layer SE, and a first capacitor electrode C1 is formed over the second capacitor electrode C2. The semiconductor layer SE is in contact with a portion of the source S and a portion of the drain D. In one embodiment, a conductive layer (not shown) is blanket formed over the semiconductor layer SE and the gate dielectric layer 120, and a third photolithographic and etching process using a third photo mask is then performed on the conductive layer to form the source S, the drain D and the first capacitor electrode C1. In one embodiment, when the source S, the drain D and the first capacitor electrode C1 are formed, a data line (not shown) and a common electrode line (not shown) are simultaneously formed, and the source S, the drain D, the first capacitor electrode C1, the data line and the common electrode line are belong to a same patterned conductive layer. In one embodiment, the first capacitor electrode C1 is coupled or connected to the common electrode line, and thus may have a common voltage potential.

As shown in FIG. 2E, a passivation layer 130 is formed over the gate G, the second capacitor electrode C2, the semiconductor layer SE, the source S, the drain D and the first capacitor electrode C1. In one embodiment, the passivation layer 130 is blanket formed over the gate G, the second capacitor electrode C2, the semiconductor layer SE, the source S, the drain D and the first capacitor electrode C1. In one embodiment, a fourth photolithographic and etching process using a fourth photo mask is performed on the passivation layer 130 to form a second opening O2 through the passivation layer 130, a third opening O3 through the drain D and a first opening O1 through the gate dielectric layer 120. The second opening O2 is substantially aligned with the third opening O3, and the third opening O3 is substantially aligned with the first opening O1.

As shown in FIG. 2F, a pixel electrode PE is formed over the passivation layer 130, and the pixel electrode PE is substantially aligned with the first capacitor electrode C1. In one embodiment, a pixel electrode material layer (not shown) is blanket formed over the passivation layer 130, and a fifth photolithographic and etching process using a fifth photo mask is then performed on the pixel electrode material layer to form the pixel electrode PE. In one embodiment, as shown in FIG. 2F, the pixel electrode PE is not only formed over the first capacitor electrode C1 and the second capacitor electrode C2 but also formed in the second opening O2, the third opening O3 and the first opening O1, and in contact with the second capacitor electrode C2 and the drain D, and thus a potential of the second capacitor electrode C2 is equal to that of the pixel electrode PE.

As shown in FIG. 2F, the formed pixel structure including the bottom gate type thin film transistor includes two capacitors, which are constituted by the second capacitor electrode C2 which has a potential equal to that of the pixel electrode PE, the gate dielectric layer 120, the first capacitor electrode C1 having the common voltage potential, the passivation layer 130 and the pixel electrode PE. The pixel structure including the bottom gate type thin film transistor has enough capacitance.

If the pixel structure including the top gate type thin film transistor having two capacitors is designed according to the pixel structure including the bottom gate type thin film transistor of FIG. 2F, the second capacitor electrode C2 of FIG. 1F should have a common voltage potential, and the first capacitor electrode C1 should not have the common voltage potential. As such, peripheral circuits should be drastically changed. Therefore, the present disclosure provides the method of manufacturing the pixel structure including the top gate type thin film transistor (referring to FIGS. 1A to 1F) with enough capacitance or the pixel structure including the bottom gate type thin film transistor (referring to FIGS. 2A to 2F) with enough capacitance without changing peripheral circuits. In other words, layouts of the constituted components of the embodiment of FIGS. 1A to 1F are the same as those of FIGS. 2A to 2F, and the constituted components of FIGS. 1A to 1F and those of FIGS. 2A to 2F can be fabricated by a same set of photo masks, and the difference therebetween is sequence of forming the constituted components. As such, after development of a pixel structure including one type thin film transistor and peripheral circuits thereof, there is no need to spend time for developing a pixel structure including the other type thin film transistor and peripheral circuits thereof.

The present disclosure further provides a pixel structure. FIG. 1F is a cross-sectional view of a pixel structure according to one embodiment of the present disclosure. As shown in FIG. 1F, the pixel structure includes: a source S, a drain D and a first capacitor electrode C1 over a substrate 110, in which the first capacitor electrode C1 has a common voltage potential; a semiconductor layer SE in contact with a portion of the source S and a portion of the drain D; a gate G and a second capacitor electrode C2, and the gate G over the semiconductor layer SE, the source S and the drain D, and the second capacitor electrode C2 over the first capacitor electrode C1, and the second capacitor electrode C2 substantially aligned with the first capacitor electrode C1; a gate dielectric layer 120 between the semiconductor layer SE, the source S, the drain D and the first capacitor electrode C1, and the gate G and the second capacitor electrode C2; a passivation layer 130 over the source S, the drain D, the first capacitor electrode C1, the semiconductor layer SE, the gate G and the second capacitor electrode C2; and a pixel electrode PE over the passivation layer 130.

In one embodiment, the second capacitor electrode C2 has a potential equal to a potential of the pixel electrode PE. In one embodiment, the gate dielectric layer 120 has a first opening O1 through the gate dielectric layer 120, and the second capacitor electrode C2 is in the first opening O1. In one embodiment, the passivation layer 130 has a second opening O2 through the passivation layer 130 and over the first opening O1 and substantially aligned with the first opening O1. The pixel electrode PE is in the second opening O2 and in contact with the second capacitor electrode C2. In one embodiment, the drain D has a third opening O3 through the drain D, and the third opening O3 is beneath the first opening O1 and substantially aligned with the first opening O1. The pixel electrode PE is connected to the drain D through the second capacitor electrode C2.

FIG. 2F is a cross-sectional view of a pixel structure according to another embodiment of the present disclosure. As shown in FIG. 2F, the pixel structure includes: a gate G and a second capacitor electrode C2 over a substrate 110; a gate dielectric layer 120 over the gate G and the second capacitor electrode C2; a semiconductor layer SE over the gate dielectric layer 120 and the gate G; a source S, a drain D and a first capacitor electrode C1, and the source S and the drain D over the gate G, and the semiconductor layer SE in contact with a portion of the source S and a portion of the drain D, and the first capacitor electrode C1 over the second capacitor electrode C2, and the first capacitor electrode C1 substantially aligned with the second capacitor electrode C2, and the first capacitor electrode C1 having a common voltage potential; a passivation layer 130 over the source S, the drain D, the first capacitor electrode C1, the semiconductor layer SE, the gate G and the second capacitor electrode C2; and a pixel electrode PE over the passivation layer 130.

In one embodiment, the second capacitor electrode C2 has a potential equal to a potential of the pixel electrode PE. In one embodiment, the passivation layer 130 has a second opening O2 through the passivation layer 130, and the pixel electrode PE is in the second opening O2 and in contact with the second capacitor electrode C2. In one embodiment, the drain D has a third opening O3 through the drain D, and the third opening O3 is beneath the second opening O2 and substantially aligned with the second opening O2. The pixel electrode PE is in the second opening O2 and the third opening O3. In one embodiment, the gate dielectric layer 120 has a first opening O1 through the gate dielectric layer 120, and the first opening O1 is beneath the third opening O3 and substantially aligned with the third opening O3. The pixel electrode PE is in the first opening O1.

It will be apparent to those ordinarily skilled in the art that various modifications and variations may be made to the structure of the present disclosure without departing from the scope or spirit of the invention. In view of the foregoing, it is intended that the present disclosure cover modifications and variations thereof provided they fall within the scope of the following claims.

What is claimed is:

1. A method of manufacturing a pixel structure, comprising:

forming a source, a drain and a first capacitor electrode;

forming a semiconductor layer in contact with a portion of the source and a portion of the drain;

forming a gate and a second capacitor electrode, and the second capacitor electrode substantially aligned with the first capacitor electrode;

forming a gate dielectric layer between the semiconductor layer, the source, the drain and the first capacitor electrode, and the gate and the second capacitor electrode;

forming a first opening through the gate dielectric layer;

forming a third opening through the drain and substantially aligned with the first opening;

forming a passivation layer over the source, the drain, the first capacitor electrode, the semiconductor layer, the gate and the second capacitor electrode; and forming a pixel electrode over the passivation layer, and the pixel electrode substantially aligned with the first capacitor electrode;

wherein forming the gate dielectric layer is performed after forming the source, the drain and the first capacitor electrode, and forming the gate and the second capacitor electrode comprises forming the second capacitor electrode in the first opening and the third opening, or forming the gate dielectric layer is performed before forming the source, the drain and the first capacitor electrode, and forming the pixel electrode comprises forming the pixel electrode in the third opening.

2. The method of claim 1, wherein the second capacitor electrode has a potential equal to a potential of the pixel electrode.

3. The method of claim 1, further comprising forming a second opening through the passivation layer, and the second opening is substantially aligned with the first opening, and forming the pixel electrode comprises forming the pixel electrode in the second opening and in contact with the second capacitor electrode.

4. A pixel structure, comprising:
a source;
a drain, wherein the drain has a third opening;
a first capacitor electrode having a common voltage potential;
a semiconductor layer in contact with a portion of the source and a portion of the drain;
a gate located over the semiconductor layer, the source and the drain;
a second capacitor electrode located over the first capacitor electrode, and the second capacitor electrode substantially aligned with the first capacitor electrode;
a gate dielectric layer located between the semiconductor layer, the source, the drain and the first capacitor electrode, and the gate and the second capacitor electrode, wherein the gate dielectric layer has a first opening, and the third opening is substantially aligned with the first opening;
a passivation layer located over the source, the drain, the first capacitor electrode, the semiconductor layer, the gate and the second capacitor electrode; and
a pixel electrode located over the passivation layer;
wherein the third opening is beneath the first opening, and the second capacitor electrode is in the first opening and the third opening, or
the third opening is over the first opening, and the pixel electrode is in the third opening.

5. The pixel structure of claim 4, wherein the second capacitor electrode has a potential equal to a potential of the pixel electrode.

6. The pixel structure of claim 4, wherein the passivation layer has a second opening over the first opening and substantially aligned with the first opening, and the pixel electrode is in the second opening and in contact with the second capacitor electrode.

* * * * *